(12) United States Patent
Zemp et al.

(10) Patent No.: US 12,433,168 B2
(45) Date of Patent: Sep. 30, 2025

(54) TRANSPARENT ULTRASOUND TRANSDUCERS

(71) Applicants: Roger Zemp, Edmonton (CA); Afshin Kashani Ilkhechi, Edmonton (CA); Zhenhao Li, Edmonton (CA); Christopher Ceroici, Edmonton (CA)

(72) Inventors: Roger Zemp, Edmonton (CA); Afshin Kashani Ilkhechi, Edmonton (CA); Zhenhao Li, Edmonton (CA); Christopher Ceroici, Edmonton (CA)

(73) Assignee: The Governors of the University of Alberta, Edmonton (CA)

(*) Notice: Subject to any disclaimer, the term of this patent is extended or adjusted under 35 U.S.C. 154(b) by 881 days.

(21) Appl. No.: 17/544,904

(22) Filed: Dec. 7, 2021

(65) Prior Publication Data

US 2022/0181540 A1  Jun. 9, 2022

Related U.S. Application Data

(60) Provisional application No. 63/122,939, filed on Dec. 8, 2020.

(51) Int. Cl.
*H10N 30/87* (2023.01)
*G01N 21/17* (2006.01)
*H10N 30/20* (2023.01)

(52) U.S. Cl.
CPC ....... *H10N 30/877* (2023.02); *G01N 21/1702* (2013.01); *H10N 30/2047* (2023.02); *H10N 30/872* (2023.02); *G01N 2021/1708* (2013.01)

(58) Field of Classification Search
CPC ............. H10N 30/877; H10N 30/2047; H10N 30/872; G01N 21/1702; G01N 2021/1706;
(Continued)

(56) References Cited

U.S. PATENT DOCUMENTS 9,793,466 B2 * 10/2017 Wang ................... H10N 30/878
11,061,124 B2   7/2021 Zemp et al.
(Continued)

FOREIGN PATENT DOCUMENTS

JP       H056713      *  3/1993

OTHER PUBLICATIONS

J. Chan, Z. Zheng, K. Bell, M. Le, P. H. Reza, and J. T. Yeow, "Photoacoustic imaging with capacitive micromachined ultrasound transducers: Principles and developments," Sensors 19(16), 3617 (2019).
J. Park, B. Park, T. Kim, D. Lee, U. Yong, J. Jang, U. Jeong, H. H. Kim, and C. Kim, "Seamlessly integrated optical and acoustical imaging systems through transparent ultrasonic transducer," in Photons Plus Ultrasound: Imaging and Sensing 2020, vol. 11240 (International Society for Optics and Photonics, 2020), p. 112401P.
(Continued)

*Primary Examiner* — J. San Martin
(74) *Attorney, Agent, or Firm* — Nathan V. Woodruff

(57) ABSTRACT

A transparent ultrasound transducer has a transparent substrate and a transparent transducer structure. The transducer structure has a bottom electrode, a top electrode electrically insulated from the bottom electrode, and an array of acoustically active elements within a separating layer between the top electrode and the bottom electrode. The top electrode and bottom electrode have a conductive transparent material. One or both of the top electrode and the bottom electrode have a composite layer made from the conductive transparent material and a supplemental material that has a greater conductivity of the conductive transparent material. A majority of an area of the composite layer comprises the conductive transparent material.

20 Claims, 12 Drawing Sheets

(58) Field of Classification Search
CPC ....... G01N 2021/1708; G01N 29/2418; G01N 29/2437

See application file for complete search history.

(56) References Cited

U.S. PATENT DOCUMENTS

| | | |
|---|---|---|
| 2020/0069289 A1 | 3/2020 | Zemp et al. |
| 2020/0282424 A1* | 9/2020 | Oralkan ................ B81B 3/0083 |

OTHER PUBLICATIONS

C. D. Gerardo, E. Cretu, and R. Rohling, "Fabrication and testing of polymer-based capacitive micromachined ultrasound transducers for medical imaging," Microsyst. Nanoeng. 4(1), 19 (2018).

X. Zhang, X. Wu, O. J. Adelegan, F. Y. Yamaner, and Ö. Oralkan, "Backward-mode photoacoustic imaging using illumination through a cmut with improved transparency," IEEE Trans. Ultrason., Ferroelect., Freq. Contr. 65(1), 85-94 (2018).

J. Chen, M. Wang, J.-C. Cheng, Y.-H. Wang, P.-C. Li, and X. Cheng, "A photoacoustic imager with light illumination through an infrared-transparent silicon cmut array," IEEE Trans. Ultrason., Ferroelect., Freq. Contr. 59(4), 766-775 (2012).

Z. Li, A. K. Ilkhechi, and R. Zemp, "Transparent capacitive micromachined ultrasonic transducers (CMUTs) for photoacoustic applications," Opt. Express 27(9), 13204-13218 (2019).

A. Dangi, S. Agrawal, and S.-R. Kothapalli, "Lithium niobate-based transparent ultrasound transducers for photoacoustic imaging" Opt. Lett. vol. 44, No. 21, 5326 (2019).

P. Hajireza, K. Krause, M. Brett, and R. Zemp, "Glancing angle deposited nanostructured film Fabry-Perot etalons for optical detection of ultrasound", Opt. Express vol. 21, No. 5, 6391 (2013).

Y. Li, Z. Zhu, J. C. Jing, J. J. Chen, A. E. Heidari, Y. He, J. Zhu, T. Ma, M. Yu, Q. Zhou, and Z. Chen, "High-Speed Integrated Endoscopic Photoacoustic and Ultrasound Imaging System", IEEE J. Sel. Top. Quantum Electron., vol. 25, No. 1, 7102005 (2019).

C. Fang, H. Hu, and J. Zou, "A focused optically transparent pvdf transducer for photoacoustic microscopy," IEEE Sensors J. 20(5), 2313-2319 (2020).

X. Zhang, O. Adelegan, F. Y. Yamaner, and Ö. Oralkan, "An optically transparent capacitive micromachined ultrasonic transducer (cmut) fabricated using su-8 or bcb adhesive wafer bonding," in 2017 IEEE International Ultrasonics Symposium (IUS), (2017), pp. 1-4.

D.-C. Pang and C.-M. Chang, "Development of a novel transparent flexible capacitive micromachined ultrasonic transducer," Sensors 17(6), 1443 (2017).

S. V. Thathachary and S. Ashkenazi, "Toward a highly sensitive polymer waveguide fiber fabry-pérot ultrasound detector," J. Biomed. Opt. 23(10), 1 (2018).

H. Li, B. Dong, Z. Zhang, H. F. Zhang, and C. Sun, "A transparent broadband ultrasonic detector based on an optical micro-ring resonator for photoacoustic microscopy," Sci. Rep. 4(1), 4496 (2015).

R. Shnaiderman, G. Wissmeyer, O. Ülgen, Q. Mustafa, A. Chmyrov, and V. Ntziachristos, "A submicrometre silicon-on-insulator resonator for ultrasound detection," Nature 585(7825), 372-378 (2020).

* cited by examiner

TRANSPARENT ULTRASOUND TRANSDUCERS

TECHNICAL FIELD

This relates to ultrasound transducers, and in particular, transducers that are transparent to visible light.

BACKGROUND

Photoacoustic imaging combines the advantages of optical absorption contrast and low scattering of ultrasound during propagation in tissues resulting in images with optical contrast and deep penetration depth. Commonly used photoacoustic imaging systems contain a pulsed laser that irradiates the tissues in a scanning mode. Tissues are locally heated at the irradiated locations and expand transiently producing photoacoustic signals in the MHz range. Then, an ultrasound transducer is used to receive the generated photoacoustic signals. Some of the most commonly used ultrasonic transducers are based on the piezoelectric effect, optical-based ultrasound sensing, and electrostatic-based sensors. Piezoelectric transducers have been well developed for years using piezoelectric ceramics, which are usually not transparent. An example of a photoacoustic imaging system is given in U.S. Pat. No. 6,833,540 entitled "System for measuring a biological parameter by means of photoacoustic interaction".

SUMMARY

According to an aspect, there is provided a transparent ultrasound transducer, comprising a transparent substrate and a transparent transducer structure comprising a bottom electrode adjacent to the substrate, a top electrode electrically insulated from the bottom electrode, and an array of acoustically active elements within a separating layer between the top electrode and the bottom electrode, wherein the top electrode and the bottom electrode comprising a conductive transparent material, the top electrode, the bottom electrode, or both the top electrode and the bottom electrode comprise a composite layer made from the conductive transparent material and a supplemental material that has a conductivity greater than a conductivity of the conductive transparent material, and a majority of an area of the composite layer comprises the conductive transparent material.

According to other aspects, the transparent ultrasound transducer may comprise on or more of the following features, alone or in combination: the supplemental material may comprise strips of metal; supplemental material may comprise less than about 30% of the area of the composite surface; the transparent ultrasound transducer may have a transparency of at least 70% within a selected range of wavelengths; the acoustically active elements may comprise cavities, a membrane, and an insulating layer; the membrane may comprise one or more materials selected from a group consisting of: silicon nitride, silicon dioxide, diamond, glass, quartz, and lithium niobate; the acoustically active elements may comprise piezoelectric material or electrostrictive material; the transparent ultrasound transducer may further comprise a plurality of additional transparent transducer structures, wherein each transparent transducer structure is defined by an electrically isolated top electrode; and the transparent ultrasound transducer may further comprise a plurality of additional transparent transducer structures, wherein each transparent transducer structure is defined by an electrically isolated bottom electrode According to an aspect, there is provided an acoustic imaging system comprising at least one transparent ultrasound transducer comprising a transparent substrate, a transparent transducer structure comprising a bottom electrode adjacent to the substrate, a top electrode electrically insulated from the bottom electrode, and an array of acoustically active elements within a separating layer between the top electrode and the bottom electrode wherein the top electrode and the bottom electrode comprising a conductive transparent material, the top electrode, the bottom electrode, or both the top electrode and the bottom electrode comprise a composite layer made from the conductive transparent material and a supplemental material that has a conductivity that is greater than a conductivity of the conductive transparent material, and a majority of a surface area of the composite surface comprises the conductive transparent material, a voltage source configured to apply a voltage between the top electrode and the bottom electrode, an excitation source that is configured to excite a sample to be imaged, a receiver connected to receive electrical signals generated by the transducer structure, and a processor that receives the electrical signals from the receiver and generates an image of the sample.

According to other aspects, the acoustic imaging system may comprise one or more of the following features, alone or in combination: the excitation source may comprise a light source that illuminates the sample; the light source may illuminate the sample through the at least one transparent ultrasound transducer; the acoustic imaging may further comprise an optical receiver positioned to receive light from the sample through the at least one transparent ultrasound transducer; the at least one transparent transducer structure may further comprise a plurality of additional transparent transducer structures, wherein each transparent transducer structure is defined by an electrically isolated top electrode; the at least one transparent transducer structure may further comprise a plurality of additional transparent transducer structures, wherein each transparent transducer structure is defined by an electrically isolated bottom electrode; wherein the supplemental material may comprise strips of metal; the supplemental material may comprise less than about 30% of the area of the composite surface; the at least one transparent ultrasound transducer may have a transparency of at least 70% within a selected range of wavelengths; the acoustically active elements may comprise cavities and membrane and an insulating layer, or piezoelectric material, or electrostrictive material; and the membrane may comprise one or more materials selected from a group consisting of silicon nitride, silicon dioxide, diamond, glass, quartz, and lithium niobate In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION OF PREFERRED EMBODIMENTS

Figure 1A:
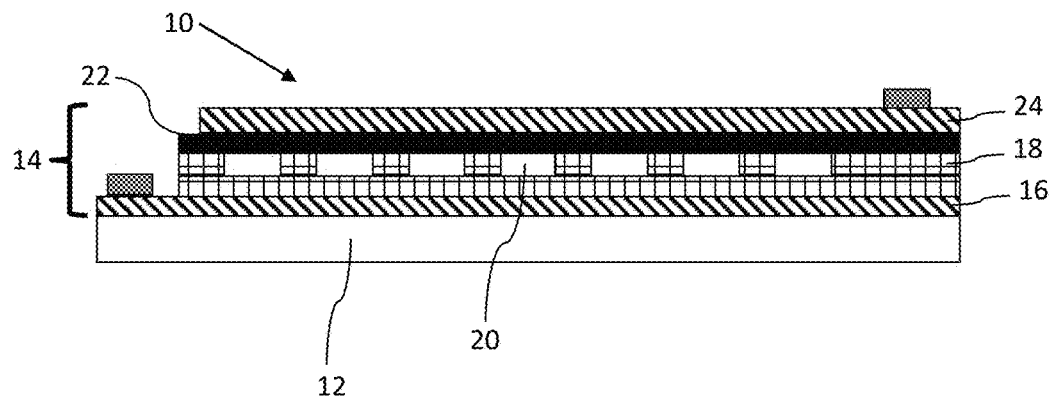
FIG. 1a is an example of a transparent CMUT.
Figure 2:
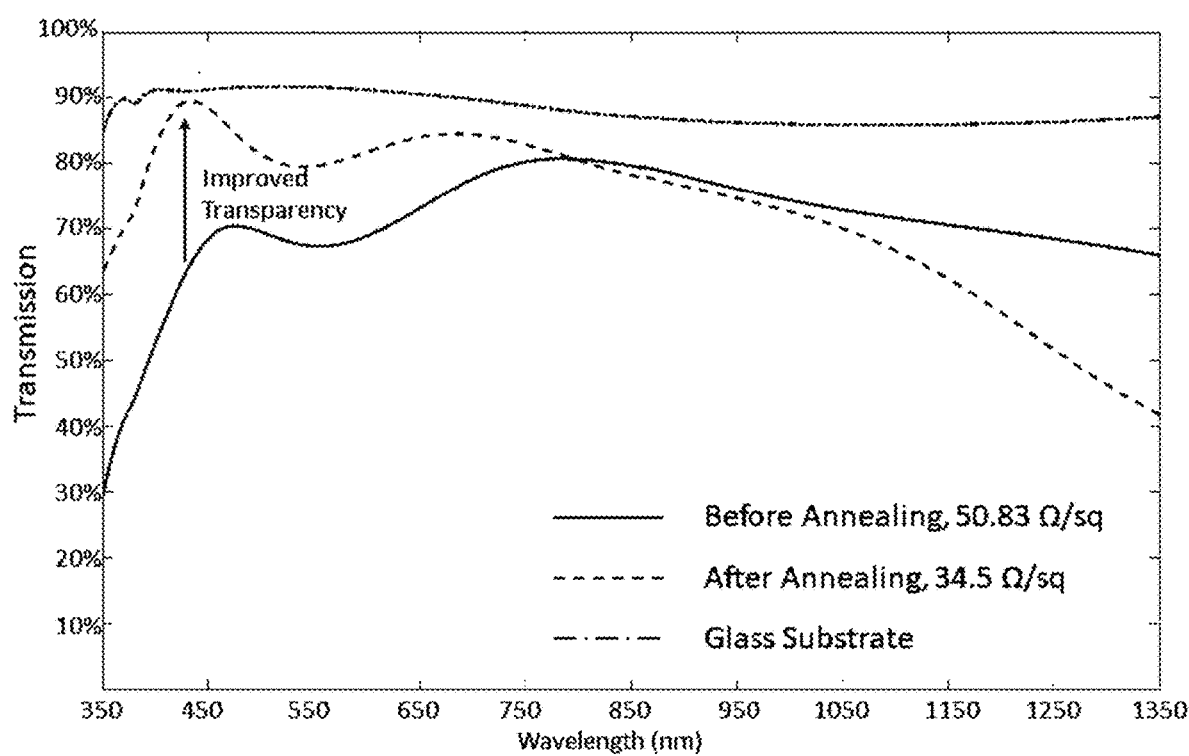
FIG. 2 is a plot of optical transmission vs. wavelength of light of an ITO thin film, showing improved transparency of the ITO thin film after annealing.

A transparent transducer, generally identified by reference numeral 10, will now be described with reference to FIG. 1a through 15. An example of a transducer will first be described, along with a description of an example of a fabrication process for a transparent transducer and a description of the transducer operation. A description of transparent transducer 10 will then be given in the context of these examples, with the understanding that the principles discussed below may be applicable to other suitable transducer structures.

Transparent Capacitive Micromachined Ultrasonic Transducers (CMUTs) for Photoacoustic Applications Referring to FIG. 1a, an example of a transparent CMUT is shown with a substrate 12, a bottom electrode 16, a separating layer 18 with cavities 20 formed therein, a membrane 22 on top of separating layer, and a top electrode 24.

Using CMUTs for transducers may provide advantages with respect to design flexibility, capability in array fabrication, and/or enhanced acoustic impedance matching when compared to piezoelectric transducers.

CMUTs may be made by surface micromachining methods or by wafer bonding methods. Surface micromachining methods may require up to 6 to 7 or more film deposition, lithography, and etching processes, which may make the fabrication more complicated than the wafer bonding method. Compatibility between device materials and etching solvents or gases may also limit the material selection. The example uses a wafer bonding method to fabricate CMUTs for the purpose of producing transparent transducers. Silicon, silicon dioxide, and silicon nitride may be used for CMUTs. Other materials such as glass, conductive oxide such as indium tin oxide (ITO), and polymers such as SU-8 or benzocyclobutene (BCB) may also be used for producing CMUTs. Among these materials, the polymers, ITO and silicon nitride are reasonably transparency in the visible range, while silicon provides relatively good transparency in the infrared (IR) range. Silicon transparency may also degrade with doping levels. Functioning CMUTs may be made using polymers, however cavities may not be sealed, and membranes may not be transparent. It will be understood that other materials not mentioned above may be used to fabricate transparent or non-transparent CMUTs.

Polymer membranes may have much lower Young's Modulus than silicon-based materials that may result in a limitation in operational frequencies. In one previous example a CMUT design using SU-8 as membrane with thickness of 3.07 µm and diameter of 50 µm had an in-air resonance at 2.83 MHz. In comparison, a silicon nitride membrane, which offers good transparency in the visible range, may have an in-air resonance frequency of up to around 5 MHz or more with a membrane thickness of about 600 nm. IR-transparent CMUTs with glass substrates and silicon membranes may have functionality in photoacoustic imaging, however the transparency in the visible range may be poor and operating frequencies in immersion may only be about 1.4 MHz. It may be useful to apply illumination in the visible range for applications such as the oxygen saturation imaging of hemoglobin where molar extinctions are highest in the visible range.

In one example, an ultrasonic transducer may use ITO for both the top electrode 24 and the bottom electrode 16. The separating layer 18 may be made from photo benzocyclobutene (BCB). The membrane 22 may be made from silicon nitride, which may be deposited by a Low-Pressure Vapor Deposition (LPCVD) process. Glass may be used as the substrate 12 and the transducer structure 14 may have separate structural and insulating layers. A photosensitive polymer may be used for both structural and insulating layers, or the structural and insulating layers may be made from different materials. The use of silicon nitride for the membrane 22 may provide cavities that are hermetically sealed and may have higher frequency performance compared with a polymer membrane. All materials applied to construct the CMUT example of a transducer may be highly transparent as demonstrated with spectrophotometer measurements in the visible range below.

Device Fabrication

There will now be given an example of a fabrication process for a transducer. It will be understood that other fabrication methods may be used to fabricate this or other transducer designs.

Figure 1B:
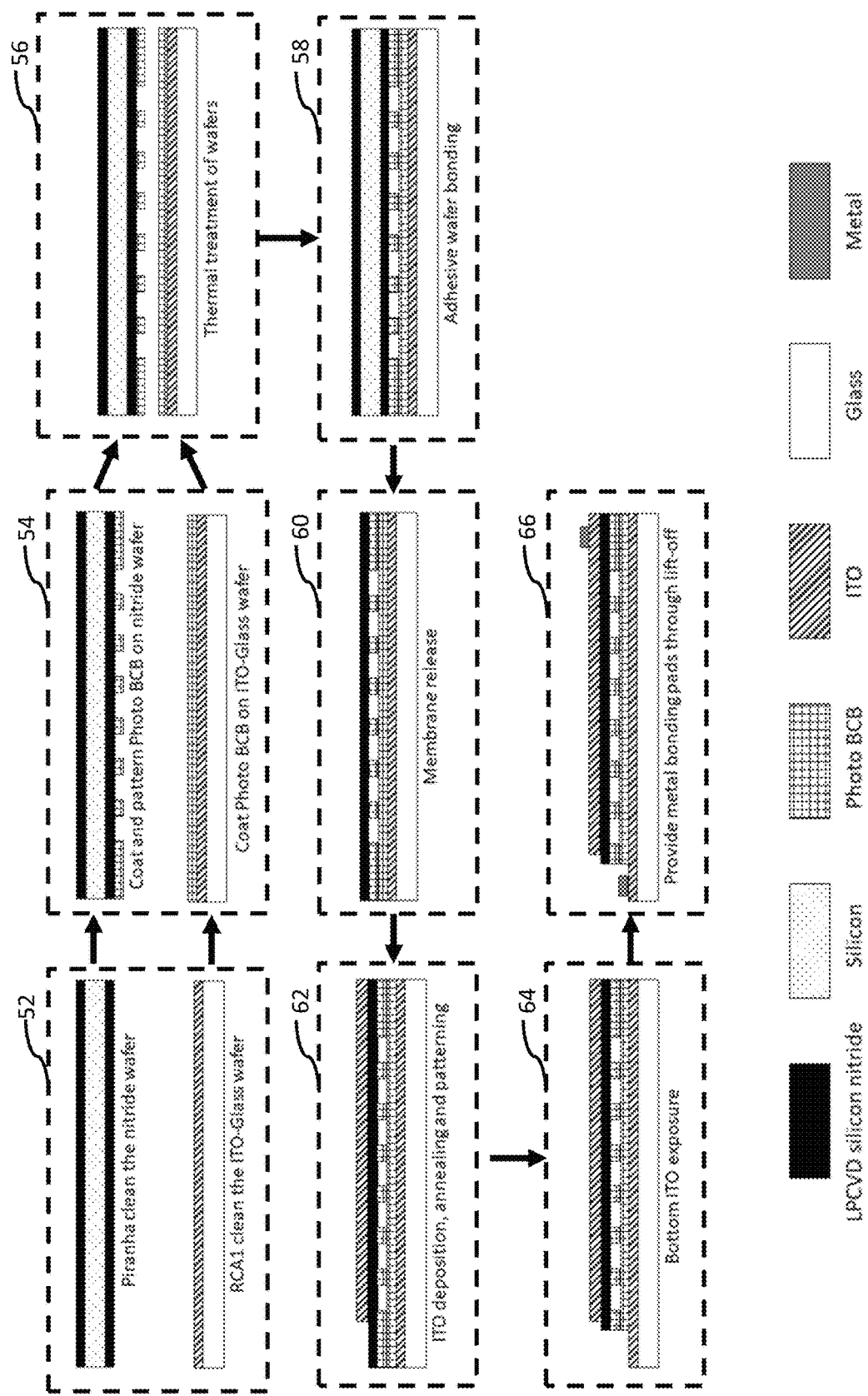
FIG. 1b is a flow chart of an example of a fabrication process for the transparent CMUT of FIG. 1a, with an elevated side view of a cross section of the transparent transducer at each process step.
Figure 3A:
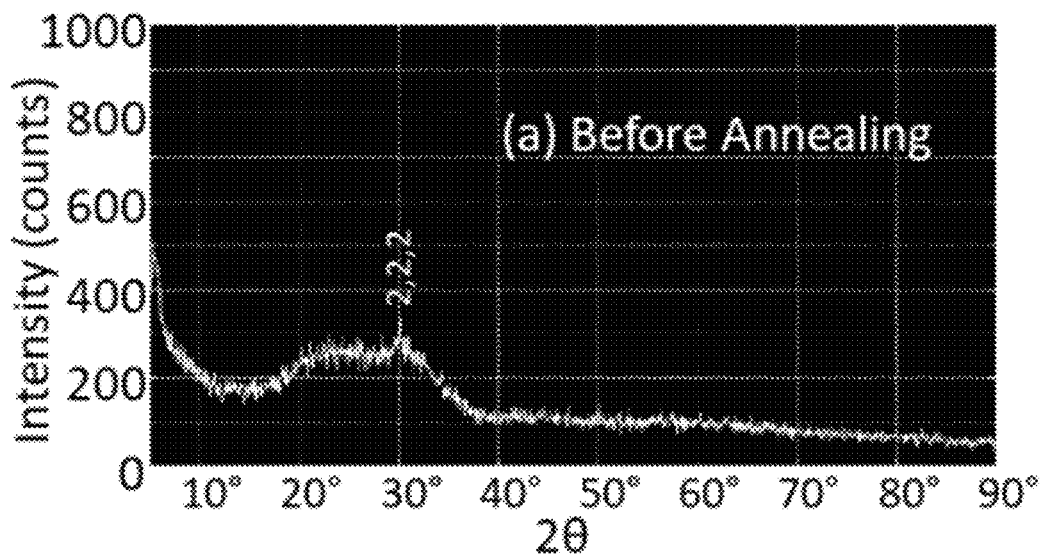
FIG. 3 is a comparison of XRD measurements of the ITO thin film before and after annealing.
Figure 3B:
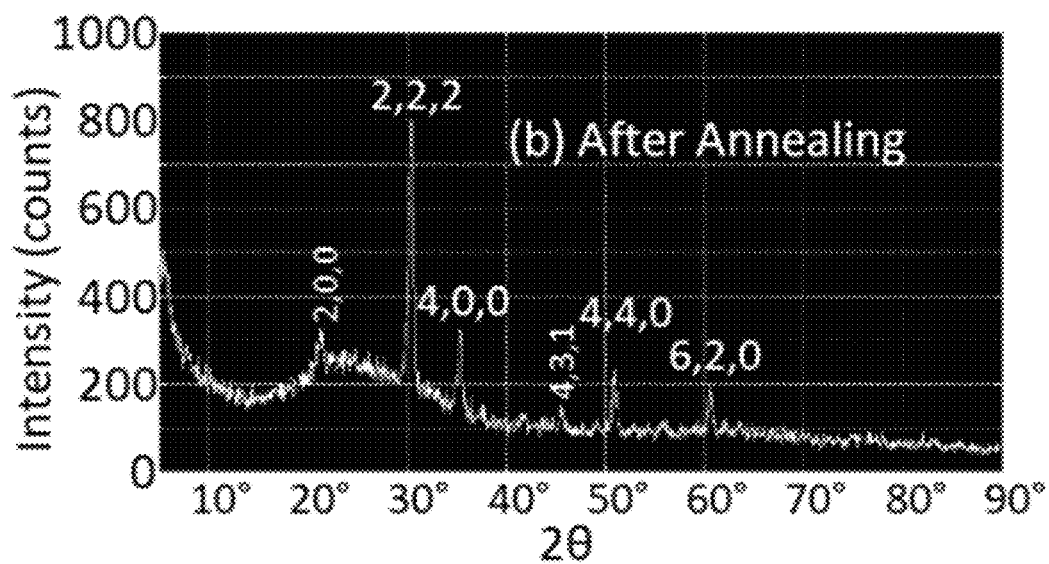
Figure 4:
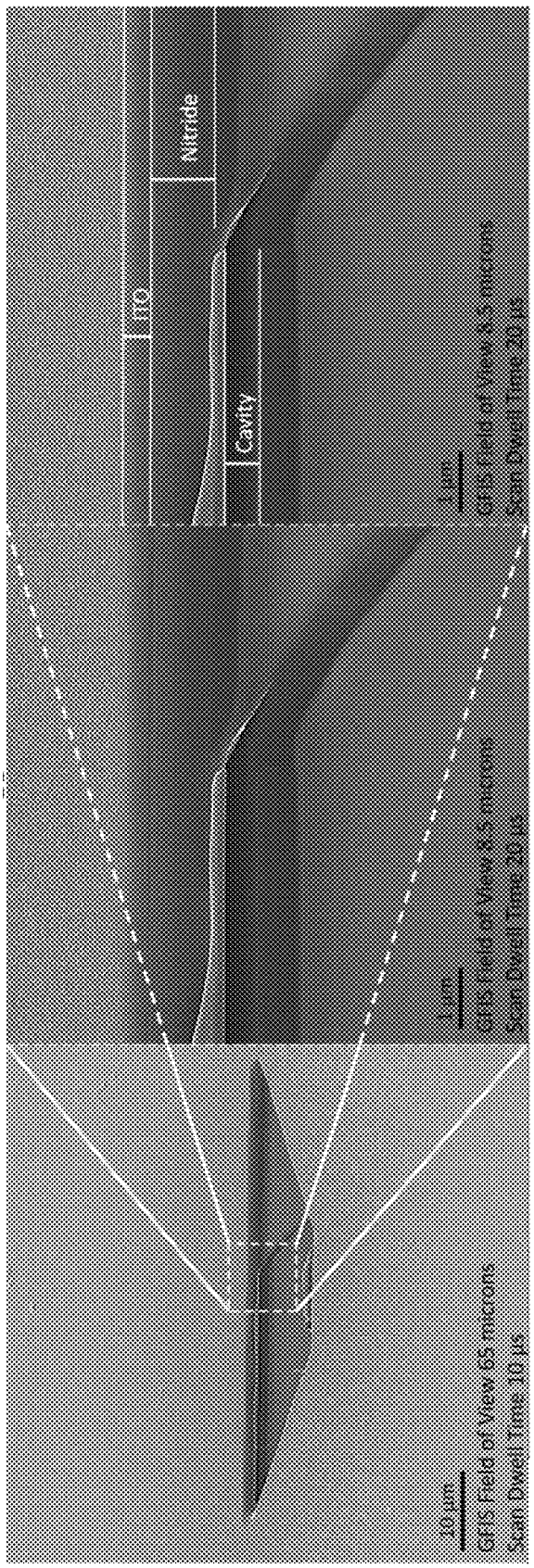
FIG. 4 is helium ion microscopy images for showing the cross section of an ultrasound transducer.
Figure 5:
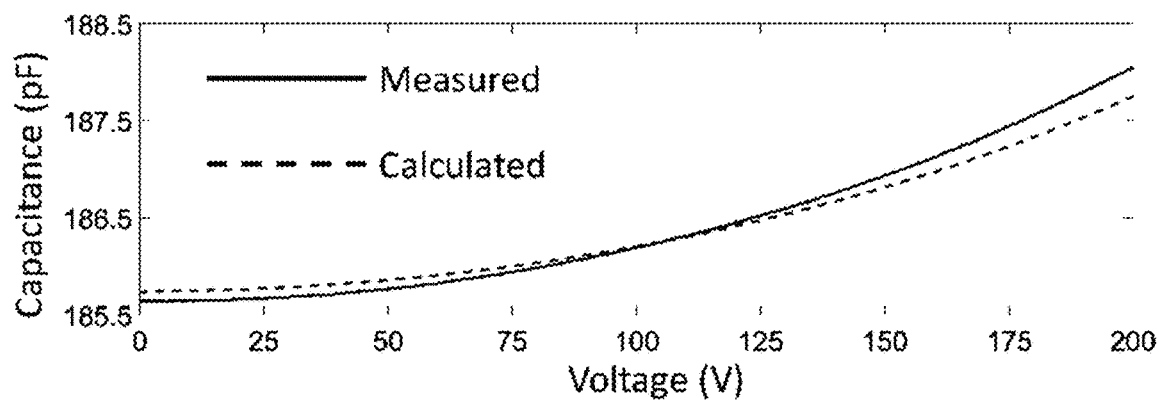
FIG. 5 is a comparison of the CV curve of a transparent ultrasound transducer and the theoretical calculation of a CV curve for the transparent ultrasound transducer.

In the example depicted in FIG. 1b, the transparent CMUTs are fabricated based on an adhesive wafer bonding technique using photo BCB as both an adhesive and structural layer. An ITO coated glass wafer (ITO-Glass wafer) and a silicon wafer with LPCVD silicon nitride coating are used as the bottom wafer and the top wafer, respectively. In this context, the term "bottom" is given with reference to the carrier, where the top layer is further from the substrate layer than the bottom layer. In one example, the thickness of the ITO coating was 500 nm with sheet resistance of 9 Ω/sq. The silicon nitride films were deposited through low pressure chemical vapor deposition (LPCVD) with film thickness of 663.4±37.3 nm. An illustration of the fabrication process is depicted in FIG. 1b.

In one example, a transparent transducer was made with a first step 52 of wafer cleaning. ITO-Glass wafers may be cleaned with RCA1 solution, a mixture of ammonium hydroxide, hydrogen peroxide and deionized water in volume ratio of 1:1:5, for 15 minutes at 75° C. LPCVD silicon nitride wafer was cleaned with a mixture of sulfuric acid and hydrogen peroxide in volume ratio of 3:1, for 15 minutes.

The second step 54 is adhesive coating and patterning. Briefly, adhesion promoter, AP 3000, was firstly spin coated on both the ITO-Glass wafer and the nitride wafer with spinning speed of 3000 RPM for 30 seconds followed by a soft baking at 150° C. for 1 minute. Then, a layer of Photo BCB was spin coated on both wafers at 5000 RPM for 30 seconds after an initial solution-spreading step at 500 RPM for 10 seconds. A soft bake at 60° C. for 90 seconds on a hotplate was applied after the spinning process. After the soft baking, the Photo BCB film on the nitride wafer was partially exposed to the UV with a patterning mask and the Photo BCB film on the ITO-Glass wafer was fully exposed to the UV without applying a mask. A post-exposure bake at 50° C. for 60 seconds was applied for both wafers before the developing process. Then, the top nitride wafer was developed with developer DS 2100 through a 2-minute puddle developing process by adding then spinning off the developer solution at 2000 RPM for 30 seconds. This second step may produce an insulating layer coated on the ITO-Glass wafer with cavities patterned on the nitride wafer.

The third step 56 involves applying thermal treatment to the coated and patterned Photo BCB films. Wafers were placed in a vacuum oven starting at room temperature then evacuating air to 625 Torr. Then, the temperature was elevated to 190° C. and maintained for an hour. The oven was then cooled to room temperature by turning off the oven and wafers were brought to the next step.

The fourth step 58 is the adhesive wafer bonding. The nitride wafer was first placed on the chuck of the bonder and the ITO-Glass wafer was placed over the nitride wafer supported with a removable spacer. After vacuuming the chamber to 5 mTorr, the spacer was removed automatically by the wafer bonder letting the ITO-Glass wafer drop onto the nitride wafer. Then, a compressive pressure of 0.5 MPa was applied to ensure contact between two wafers at the interface. Lastly, to finish the bonding, wafers were heated to 150° C. and held for 15 minutes followed by another temperature elevation to 250° C. and held for 1 hour. Once the temperature was cooled down to less than 100° C., wafers were unloaded from the wafer bonder to finish the wafer bonding step.

The fifth step 60 is membrane release. By removing the backside nitride of the nitride wafer with a dry etching process, the silicon substrate of the nitride wafer was removed by potassium hydroxide solution (concentration of 25%, solution temperature of 80° C.). Then, the nitride film is freed for vibration over the cavity regions.

The sixth step 62 is top electrode deposition and patterning. ITO films of 300 nm in thickness were sputtered on the nitride films at room temperature with 50 sccm of Ar and no oxygen under chamber pressure of 6 mTorr. The deposited ITO films presented acceptable sheet resistance (50 Ω/sq), but the transparency was poor. Therefore, an annealing process was used in a vacuum oven. One hour annealing at 245° C. in vacuum at 625 Torr was found to be sufficient to improve the transparency in the visible range. As can be found from FIG. 2, after the annealing process, the sheet resistance was found slightly enhanced from 50.83 to 34.5 Ω/sq and the transparency was greatly enhanced up to nearly 90% in the visible range. Transparency measurements were first tested on glass slides. The enhancement in both the film conductivity and the transparency is due to the crystalline structure rearrangement during the annealing process as can be demonstrated by the XRD measurement results given in FIG. 3. The ITO film was then patterned through a lithography process and wet etching process using non-diluted 35% Hydrochloric acid for about two minutes.

The last two steps 64 and 66 involve exposing the bottom electrode and depositing metals for wire bonding. RIE was used to etch through the nitride membrane and the photo BCB layer. The recipe for etching the nitride layer was the same as the one used in the fifth step. The recipe for BCB etching is changed to 20 sccm $CF_4$, 80 sccm Oxygen; 80 mTorr Pressure, and 40 W power. Then, a 20-nm thick layer of chromium and a 200-nm thick layer of aluminum were deposited and patterned on the ITO layers through a lift-off process to provide bond pads.

Device Characterization

Devices may be characterized to demonstrate functionality by, for example, structural inspection, capacitance-voltage (CV) testing, and receive sensitivity measurements. A photoacoustic test may also be performed to demonstrate capacity for photoacoustic imaging applications.

In one example, a focused ion beam was used to create a small opening through the CMUT exposing the cross-sectional structure. Helium ion microscopy images were then taken to inspect the structure, shown in FIG. 4. In order to minimize the damage from the ions during cutting with the ion beam, a small beam dose was chosen and the insulating Photo BCB layer was not cut through. As a result, the thickness of the top ITO layer (top electrode), $t_{ITO}$, and the total thickness of the top ITO layer, nitride layer and the two Photo BCB layers (insulating Photo BCB and structural Photo BCB constructing cavities), $t_{all}$, were measured with a contact profilometer. Knowing the thickness of the top ITO layer, the thicknesses of the nitride and cavity depth (structural Photo BCB layer) may be obtained through the helium ion microscopy image having $t_{SiN}$ and $t_{cavity}$, respectively. Then, the insulating Photo BCB layer can be calculated by $t_{BCB} = t_{all} - t_{SiN} - t_{cavity}$. Results were as follows:

| | |
|---|---|
| ITO (Top electrode) | 300 nm |
| Silicon nitride | 704 nm |
| Cavity depth | 369 nm |
| Photo BCB insulating | 1487 nm |
| ITO (Bottom electrode) | 500 nm |
| Cell Diameter | 48 μm |

| Centre-to-centre distance | 53 μm |
|---|---|
| Cell number | 6248 |

C-V testing was performed in order to inspect the functionality of the produced CMUTs. As the curve in the solid line shows in FIG. 5, a continuous and smooth increase in the capacitance was observed with the increase of the applied bias voltage from 0 to 200 V with 0.5 V increments. In order to validate the measurement data, theoretical calculations were performed based on theoretical models. The calculation results are shown as the dashed curve in FIG. 5. As can be seen, the maximum difference between the calculation results and the experimental results is only 0.2% at a bias voltage of 200 V, showing a good agreement between the fabrication and design.

Figure 6:
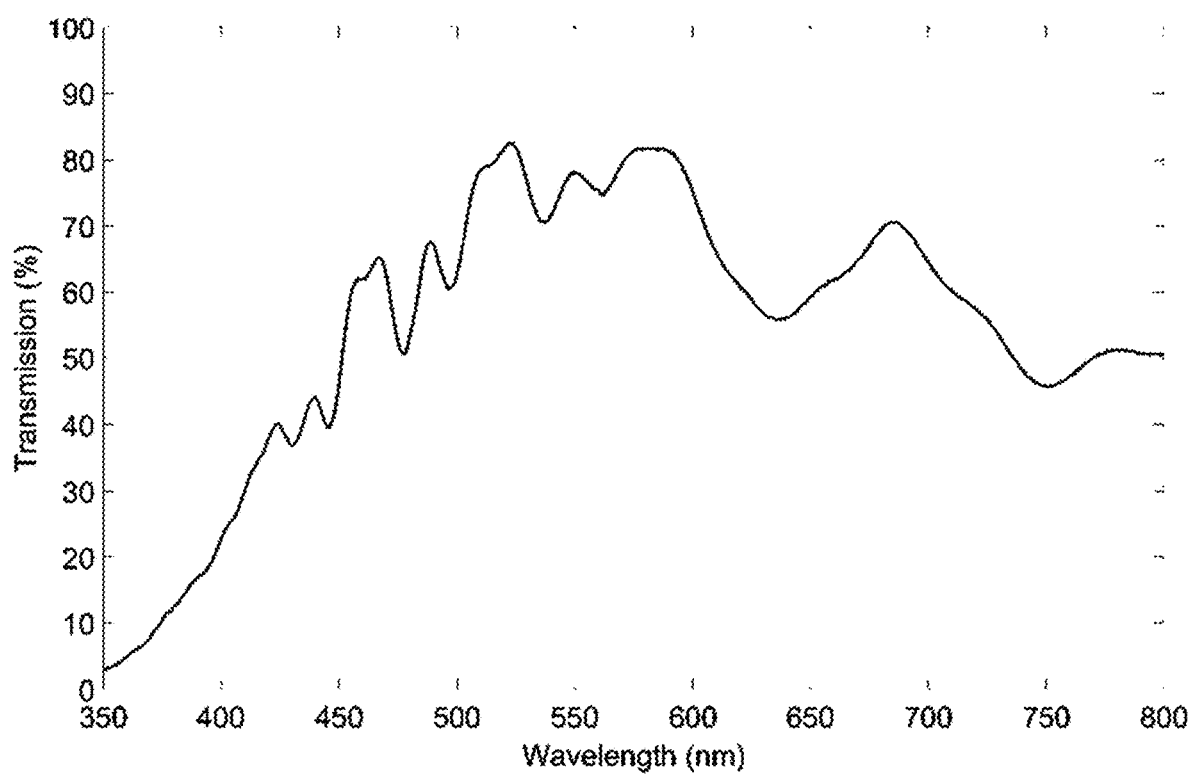
FIG. 6 is a plot of optical transmission of vs. wavelength of light for a transparent ultrasound transducer.
Figure 7:
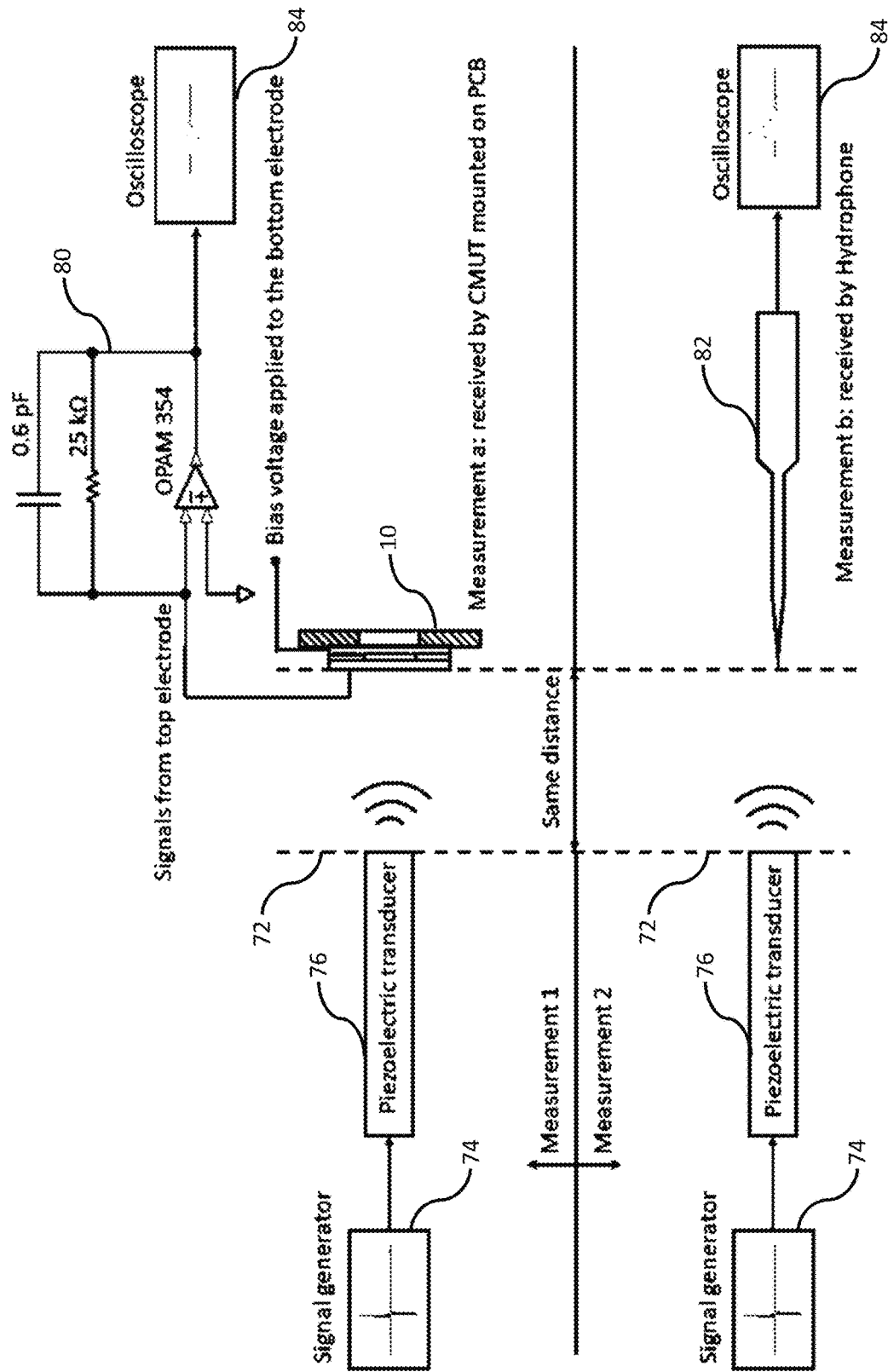
FIG. 7 is a schematic diagram of a system for obtaining the sensitivity of the transparent ultrasound transducer to acoustic pressure.

While different structures and different materials may be used in a fabricated CMUTs, the example depicted in FIG. 1a has five layers, such as (1) a transparent top electrode 24, that may be made from ITO or other suitable material; (2) a transparent membrane 22 that may be made from LPCVD silicon nitride or other suitable material; (3) a transparent insulating layer 18 that may be made from structural material such as a photo BCB layer or other suitable material, and a transparent bottom electrode made from ITO for example, and a transparent substrate such as glass. In one example of a CMUT made from these materials, the transparency was characterized after each step. Some steps, including thermal treatment and ITO annealing, may impact transparency between steps. The transparency spectrum of an example device is shown in FIG. 6. In this example, it was found that in the wavelength range from 504 nm to 605 nm, the CMUT may have more than 70% transparency. The transparency was still more than 30% in the remaining visible range, which may be higher than transparent CMUTs using thin silicon membranes. Much of the losses in transparency may be reflective rather than absorptive given the excellent visible transparency of devices.

Receive sensitivity of a CMUT may be evaluated by the ratio of the received sound signal to the corresponding acoustic pressure. An example of a test arrangement to perform receive sensitivity tests for the example CMUT described above is shown in FIG. 7, performed in a tank of vegetable oil 72. Measurement "a" and "b" show the acoustic signal generated by a piezoelectric transducer 76 and detected by a CMUT 10 and a hydrophone 78, respectively. The piezoelectric transducer 76 was driven by a signal generator 74 was used to generate pulses of ultrasound. The CMUT 10 was wire bonded to a printed circuit board (PCB) with a transimpedance amplifier setup (not shown). The setup used electronics 80, including an amplifier with open-loop gain of 90 dB under supply voltage of 5 V. The cut-off frequency of the circuit was 10.6 MHz determined by the feedback resistor (25 kΩ) and capacitor (0.6 pF). The CMUT mounted to the PCB was placed in front of the piezoelectric transducer to detect soundwaves. The PCB amplified and converted the signal from the CMUT to voltage signals, which were further recorded with an oscilloscope 84. In order to acquire the acoustic pressure at the surface of the CMUT 10, a hydrophone 82 was used in Measurement "b". By analyzing the hydrophone data, acoustic pressure was obtained and the receive sensitivity of the CMUT may be calculated.

Figure 8B:
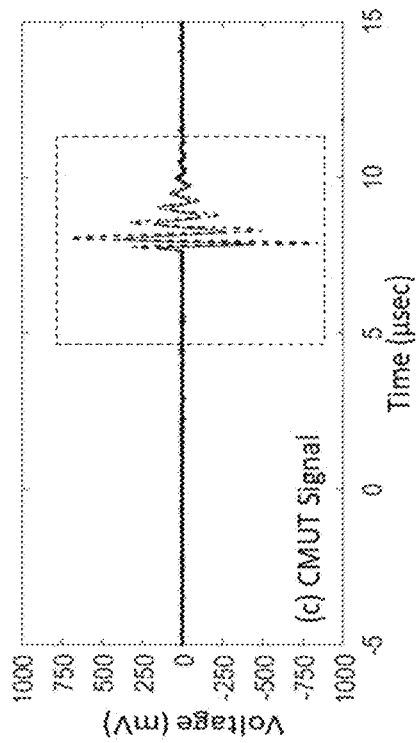
FIG. 8b is a plot of the signal received by the hydrophone in FIG. 7.
Figure 8D:
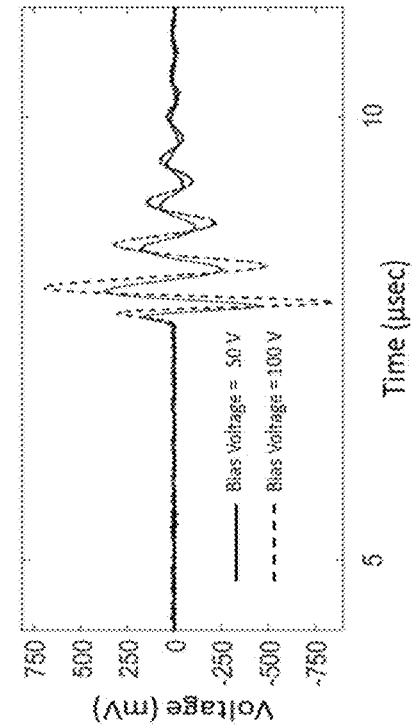
FIG. 8d is an expanded view of the signals received by the transparent ultrasound transducer in FIG. 7 at bias voltages of 50V and 100V.
Figure 8A:
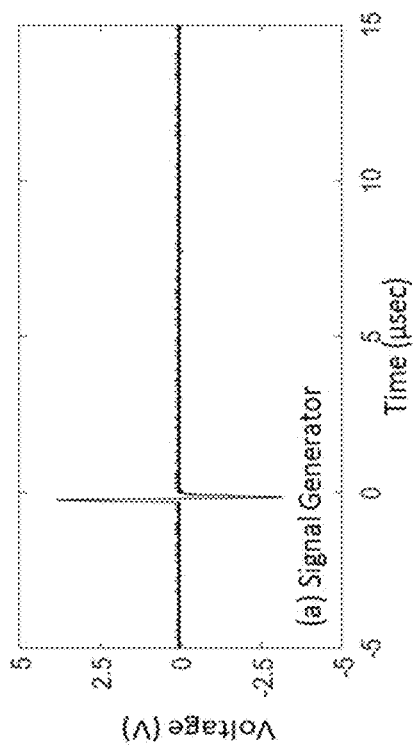
FIG. 8a is a plot of the signal used to drive the piezoelectric transducer in FIG. 7.
Figure 8C:
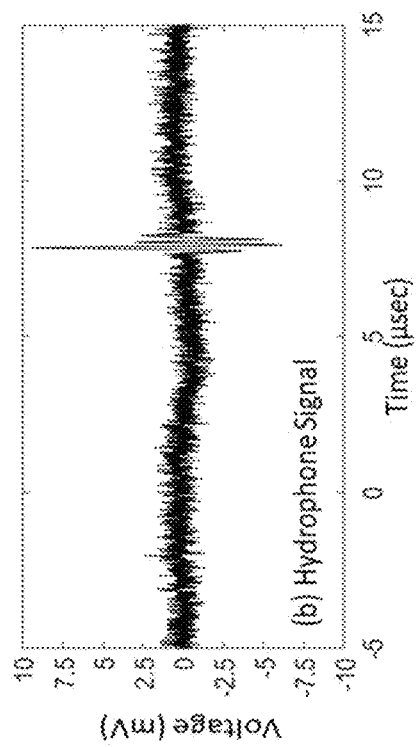
FIG. 8c is a plot of the signals received by the transparent ultrasound transducer in FIG. 7 at bias voltages of 50V and 100V.

The signal that was used to drive the piezoelectric transducer in the example given above is shown in FIG. 8a; the signal received by the hydrophone is given in FIG. 8b; and the signals received by the CMUT with bias voltages of 50 V and 100 V are given in FIG. 8c. The measured peak-to-peak values (Vpp) of the signals, hydrophone sensitivity based on the calibration data, calculated receive sensitivity, signal to noise ratio (SNR) and the noise equivalent sensitivity are summarized as follows:

| Hydrophone | Vpp | 15.9 mV | |
|---|---|---|---|
| | Receive sensitivity | 6.7 V/Pa at 5 MHz | |
| | Acoustic Pressure | 23.6 kPa | |
| CMUT | Bias Voltage | 50 V | 100 V |
| | Vpp | 824 mV | 1544 mV |
| | Receive Sensitivity | 35.0 μV/Pa | 65.5 μV/Pa |
| | SNR | 43.7 dB | 47.9 dB |
| | Noise Equivalent Sensitivity | 155 Pa | 95 Pa |

Figure 9:
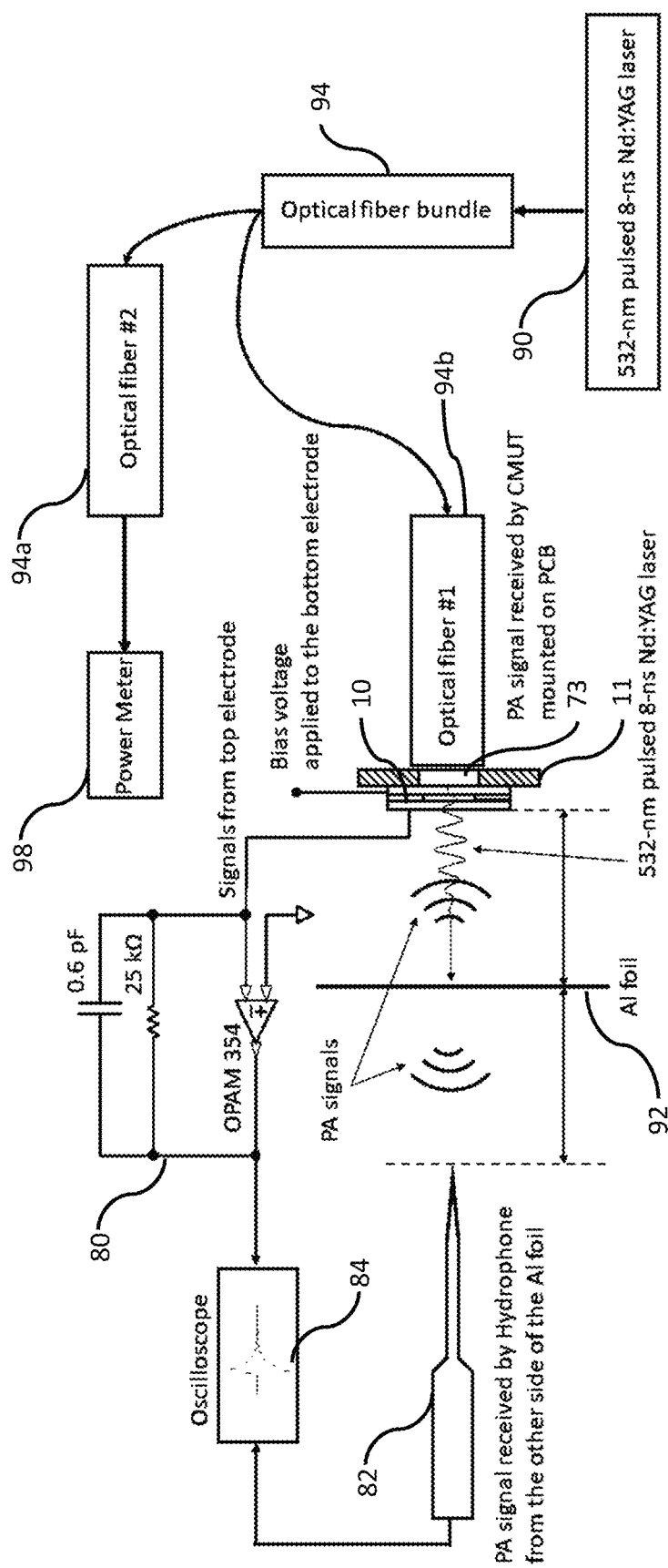
FIG. 9 is a schematic diagram of a testing system for photoacoustic testing of a transparent ultrasound transducer.

The setup of the photoacoustic test is illustrated in FIG. 9. The test was performed in a tank vegetable oil 72. A hole 73 was drilled in the PCB 11 to provide a window for laser light delivery through the CMUT 10. The active area of the CMUT is about 4 mm×4 mm, thus the diameter of the hole was made to 4.5 mm. Laser light from a 532-nm pulsed 8-ns Nd:YAG laser 90 was delivered through the CMUT 10 using an optical fiber bundle 94 at 10 Hz repetition rate. Measured laser powers of 23 mW and 50 mW emerging from the fiber bundle 84 were detected using a test optical fiber 94a and a power meter 98. The laser light was coupled to the CMUT 10 using a separate optical fiber 94b. CMUTs 10 were biased at 50 V and 100 V without effects of breakdown or pull-in. A piece of aluminum foil 92 was placed in front of the CMUT, perpendicular to the laser beam. Once the laser irradiated the aluminum foil 92, a local spot on the foil 92 produced photoacoustic signals on both sides of the foil 92. A hydrophone 82 was also placed behind the aluminum foil 92. The thickness of the aluminum foil 92 was measured to be 300 μm. Thus, the generated acoustic waves on both sides of the foil 92 were deemed similar. As a result, the characteristics of the photoacoustic signal detected by the CMUT 10 can also be analyzed by the hydrophone 82.

The detected CMUT signals and the hydrophone signals are shown in FIG. 10. The plots in FIG. 10a and FIG. 10b are the signals detected by the CMUT 10. There are four signals in each plot: Sig. 1 occurred when the laser transmitted through the CMUT. Heat was generated inside the CMUT at this moment inducing membrane vibration (Sig. 1). Acoustic waves were also generated traveling toward the aluminum foil. The echo signal is the Sig. 1e. Sig. 2 represents the photoacoustic signal from the aluminum foil 92. This signal represents the acoustic wave generated by the heated aluminum foil 92 when it was hit by the laser pulse. When this wave was reflected twice by the CMUT surface and the aluminum foil, a reverberation echo signal Sig 2e was also detected. In contrast, FIG. 10c and FIG. 10d are the signals detected by the hydrophone 82. Signals of Sig. 1e, Sig. 2 and Sig. 2e can also be found in both the plots except the signal Sig. 1. Moreover, a temporal ringing signal can be found between the Sig. 1 and Sig. 2 which may be due to in part to substrate ringing.

The maximum signal response from CMUT 10 was found when it was biased at 100 V with the laser power set to 50 mW. A frequency analysis, shown in FIGS. 11a and 11b, was performed to analyze the Sig. 2 of this maximum signal response and the corresponding hydrophone signal. The CMUT signal had a center frequency of 2 MHz with a −6-dB fractional bandwidth of 52.3%. On the other hand, the hydrophone signal appeared a center frequency of 4.1 MHz with −3-dB fractional bandwidth of 133.8%. However, the peak frequency also happens around 2 MHz.

Figure 10A:
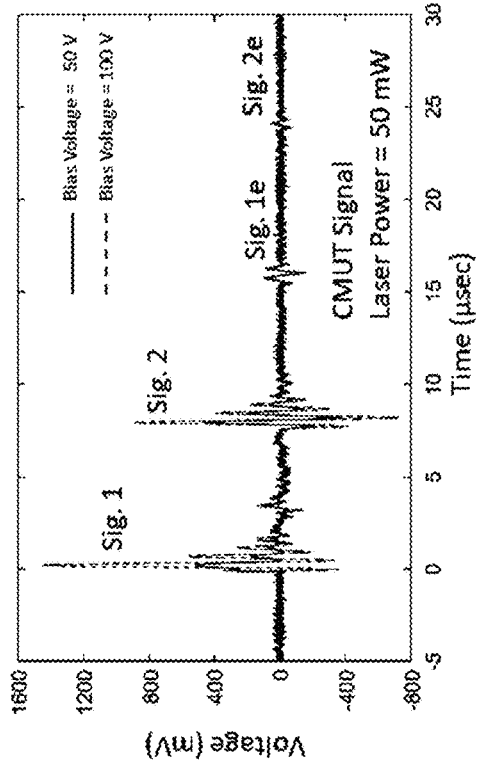
FIG. 10a is a plot of the signals received by the transparent ultrasound transducer in FIG. 9 at a laser power of 23 mW.
Figure 10B:
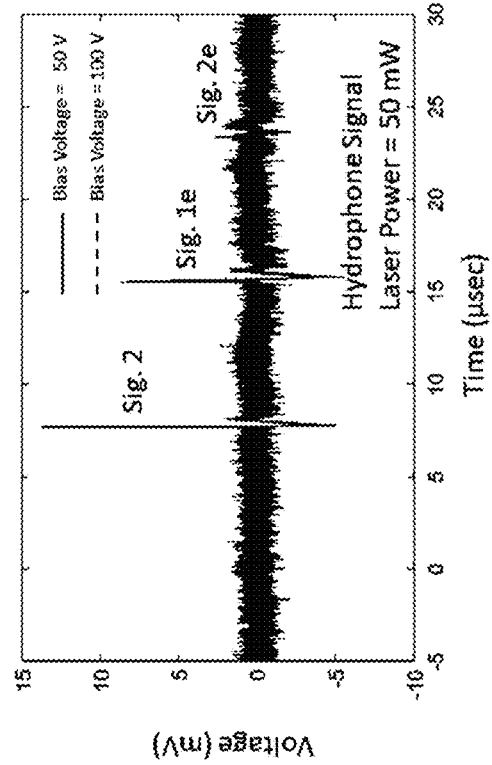
FIG. 10b is a plot of the signals received by the transparent ultrasound transducer in FIG. 9 at a laser power of 50 mW.
Figure 10C:
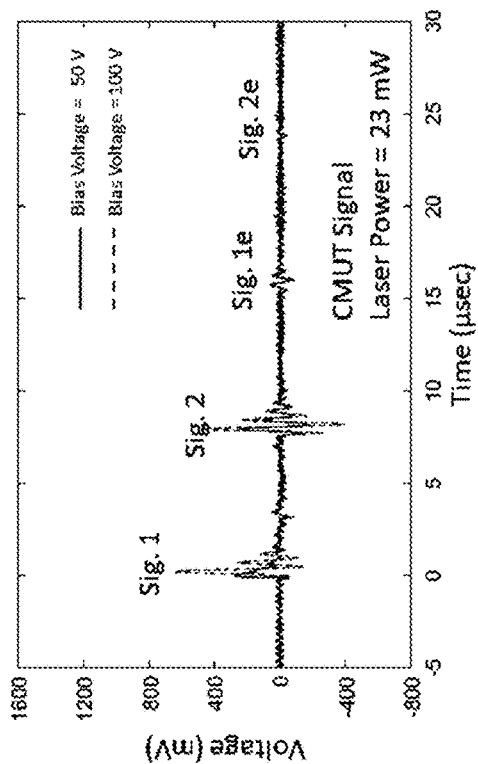
FIG. 10c is a plot of the signals received by the hydrophone in FIG. 9 at a laser power of 23 mW.
Figure 10D:
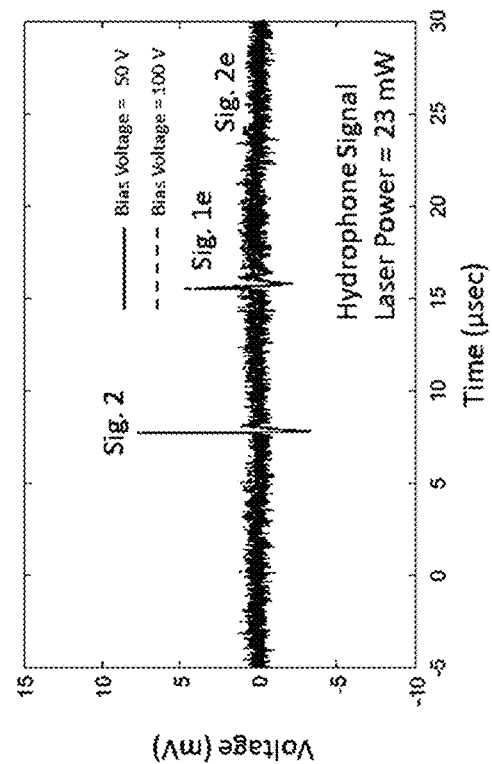
FIG. 10d is a plot of the signals received by the hydrophone in FIG. 9 at a laser power of 50 mW.
Figure 11A:
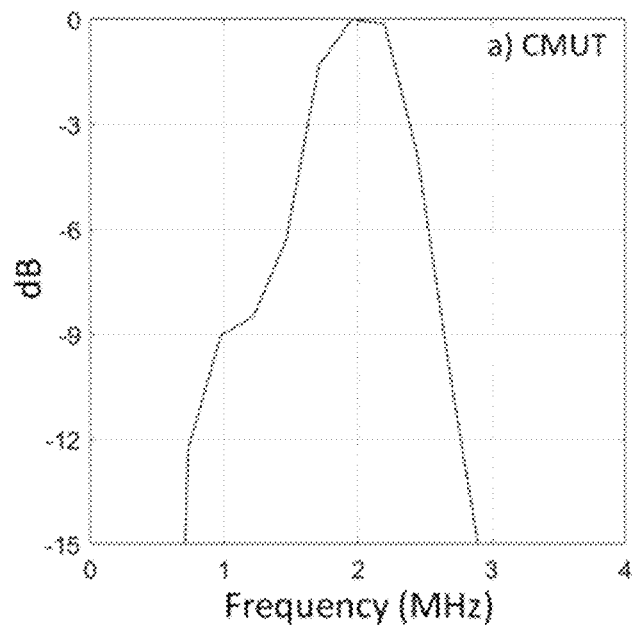
FIG. 11a is a plot of the frequency components of the signal obtained by the transparent ultrasound transducer in FIG. 9.
Figure 11B:
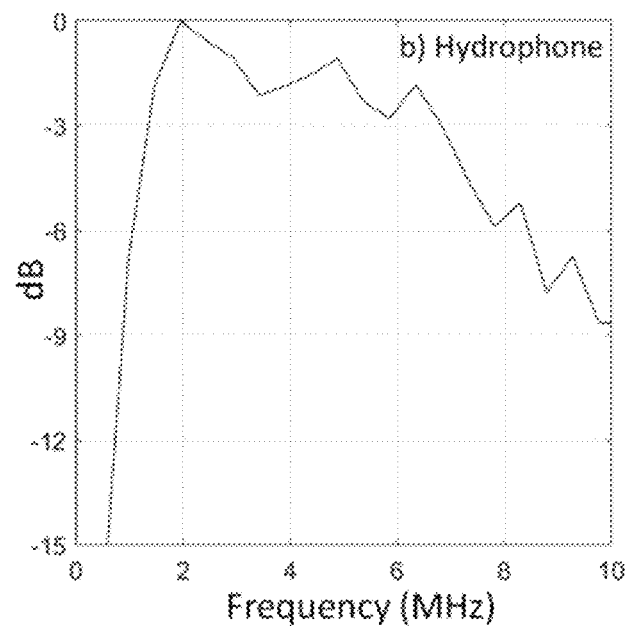
FIG. 11b is a plot of the frequency components of the signal obtained by the hydrophone in FIG. 9.

The amplitudes of the photoacoustic signal shown in FIG. 10a and FIG. 10b remained stable over 3 hours or repeated testing with a 10 Hz repetition rate laser. The devices have been tested 5 months after fabrication with no apparent degradation in performance, indicating durability and good hermetic sealing.

Figure 12:
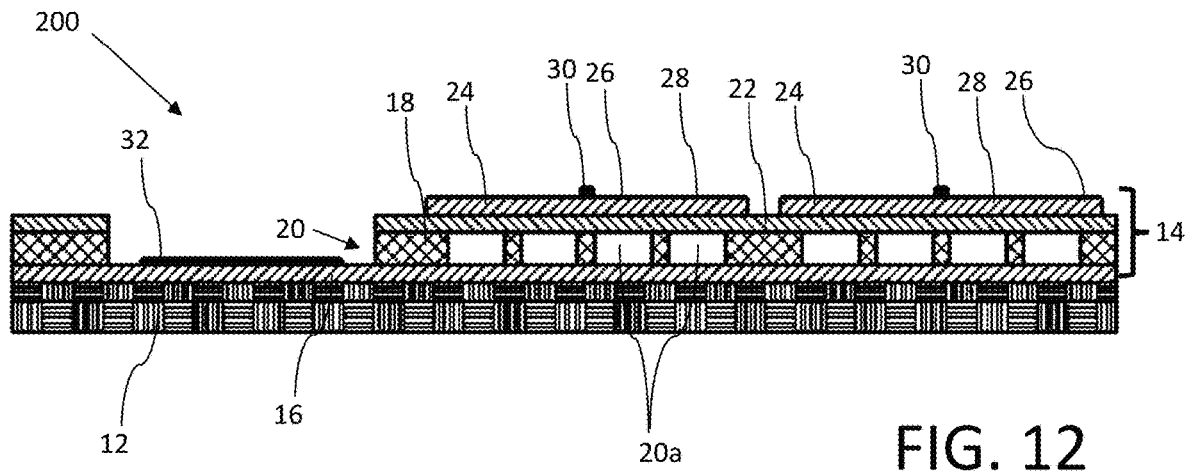
FIG. 12 is an elevated side view in cross section of a transparent ultrasound transducer.
Figure 13:
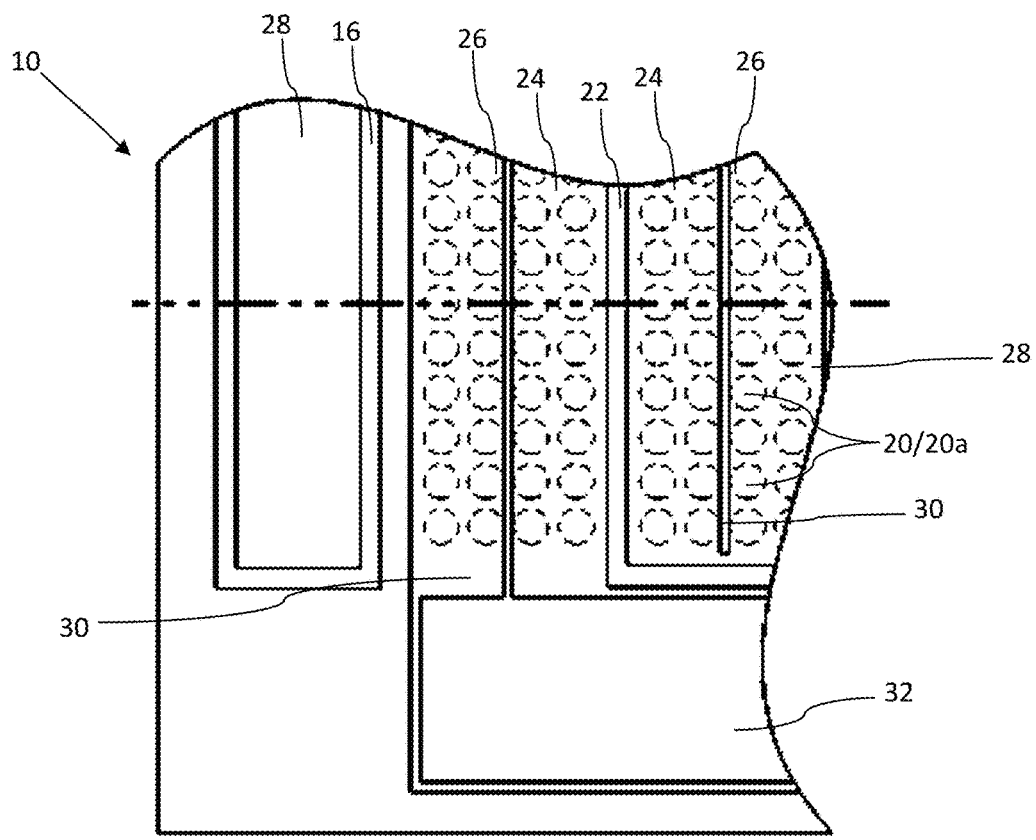
FIG. 13 is a partially see-through top view of a transparent ultrasound transducer.

A further example of a transparent ultrasound transducer, generally identified by reference numeral 200, will now be described with reference to FIG. 12 through 15. Referring to FIG. 12 and FIG. 13, transparent transducer 200 has a transparent transducer structure 14 mounted on a transparent substrate 12. Transducer structure 14 has a bottom electrode 16 adjacent to substrate 12, a top electrode 24 that is electrically insulated from bottom electrode 16, and an array of acoustically active elements 20 within a separating layer 18 between top electrode 24 and bottom electrode 16. Separating layer 18 may be made from a plurality of layers, including layers in addition to those discussed below, and may be made from a transparent insulating material, such as the photo BCB used in the CMUT example described above.

Figure 15:
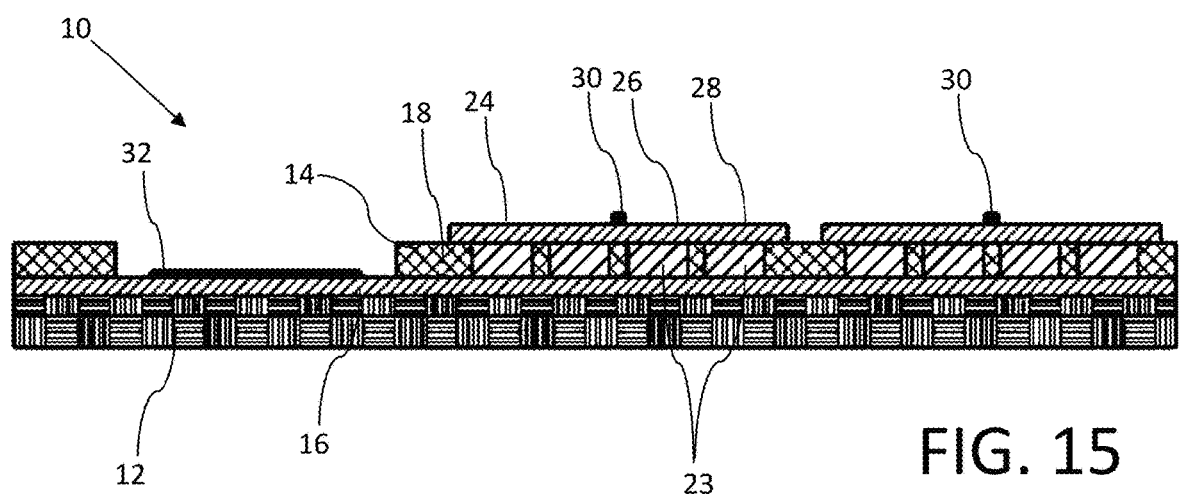
FIG. 15 is an elevated side view in cross section of a transparent ultrasound transducer with piezoelectric/electrostrictive elements.

Referring to FIG. 12, the array of acoustically active elements 20 may be formed in separating layer 18 from an array of cavities 20a formed in an insulting layer 19 and a membrane 22 located between insulating layer 19 and top electrode 24. Cavities 20 may be hermetically sealed. Membrane 22 may be made from one or more materials selected from a group consisting of silicon nitride, silicon dioxide, diamond, glass, quartz, and lithium niobate and may be positioned above or below top electrode 24. Referring to FIG. 15, in some examples, acoustically active elements may be made from piezoelectric or electrostrictive material 23 within separating layer 18, in which case membrane 22 (shown in FIGS. 1 and 12) may not be necessary.

In some examples, substrate 12 and transducer structure 14 are made from transparent material, and the top and bottom electrodes 24 and 16 are formed from conductive transparent material, which may be ITO. Depending on the specific application of transparent ultrasound transducer 10, the transparent material may be transparent to electromagnetic radiation within a selected range of wavelength. For example, the CMUT transducer described above is transparent to visible light, and as such the materials used in the CMUT example may be used as materials for substrate 12, transducer structure 14, bottom electrode 16. In other examples, transparent ultrasound transducer 10 may be transparent to IR radiation, or other bands of radiation, and as such, in alternative cases, transparent materials may refer to materials that are transparent to radiation in a corresponding band. It will be understood that transparent, when used here in reference to transparent ultrasound transducer 10, means light can pass through transducer 10 such that objects behind transducer 10 can be resolved, and that light from a source on one side of transducer 10, can be focused to a point on an opposite side of transducer 10. Typically, some light passing through transducer 10 will be absorbed, and some light may be dispersed when passing through transducer 10; transducer 10 may have a transparency of at least 70% within the selected range of wavelength discussed above.

In some examples, top electrode 24, bottom electrode 16, or both top electrode 24 and bottom electrode 16 may be composites. Referring to FIG. 13, transparent ultrasound transducer 10 is shown with top electrode 24 forming a composite layer 26 made from conductive transparent material 28 and a supplementary material 30 that has conductivity that is greater than a conductivity of the conductive transparent material. As depicted, conductive transparent material 28 may be a thin film covering the entire surface of transducer structure 14, and supplemental material 30 may be one or more strips of metal located on top of the thin film. In the depicted example, a majority of the area of composite layer 26 is made from the conductive transparent material 28 and supplemental material 30 occupies, for example, less than about 30% of the area of composite layer 26, or less than 10% of the surface area of transducer structure 14, or less than 0.1% of the surface area of transducer structure. If the supplemental material 30 is non-transparent but has a higher conductivity, supplemental material 30 may be used to reduce the resistivity of top electrode 24 without compromising the transparency of transducer 10 beyond a threshold required for a given application.

Referring again to FIG. 12, supplemental material 30 may be located on top of transparent material 28, however it will be understood that supplemental material 30 may be positioned anywhere in contact with transparent material 28, such as being located within transparent material 28, coplanar with transparent material 28, or embedded within transparent material 28. In some examples, a vertical thickness of supplemental material 30 may be adjusted without changing the portion of the area of composite layer 26 that is occupied by supplemental material 30. In other words, the vertical position and vertical thickness of supplemental material 30 may be changed with a minimal impact the footprint of supplemental material 13 when viewed from a top plan view (FIG. 13) and a corresponding minimal change to the area of composite layer 26 that is occupied by supplemental material 30. As can be seen in FIG. 12, contact pad 32 may be distinct and spaced from acoustically active elements while still in contact with bottom electrode 16, allowing electrical contact to be made without interfering with the signal transmission or reception.

In one example, top electrode 24 made with ITO has high resistivity compared to metals such as gold and aluminum which results in high resistivity of the electrode. Transducer arrays fabricated with 200 nm thick ITO with channel width of 200 μm and 7 mm length will exhibit channel resistivity in the ranges of Mega Ohms and fabricating transparent CMUT arrays with one or more metal strips along with the ITO layers may limit the electrode resistivity to the ranges of few ohms with minimum effect on the transparency of the devices (less than 1% effect on the transparency). In this method a narrow metal strip (less than 2 μm) is fabricated at the center of each channel to improve the conductivity of the channel. Bottom electrode 16 may also be made with metal strips to provide similar improvements.

Top electrode 24 and bottom electrode 16 may have exposed contact pads 32 spaced from transducer structure 14 that allow for external electronic components to make electrical connections to transducer 10. Contact pads 32 may be directly connected to metal strips 26. Contact pads may be fabricated on top of a structure, devoid of acoustically active elements, made from the same material as separating layer 18 and top electrode 24, that extends away from transducer structure. The cross section in FIG. 12 corresponds to a cross section of transducer 10 along the dashed line in FIG. 13. As shown in FIG. 13, transparent ultrasound transducer may be made from a plurality of transparent transducer structures 14 on substrate 14 that are defined by electrically isolated top electrodes 24 that correspond to a separate transparent transducer structure 14. Alternatively, or in addition to isolated top electrodes 24, transparent transducer structures 14 may have electrically isolated bottom electrodes.

To form the metal strips, a lift-off process may be used. Photoresist may be to achieve a high under-cut etching to accelerate the lift-off step. Directional metal deposition process may be performed to deposit a 1.5 μm thick metal film on the wafer. Any directional deposition method such as electron-beam evaporation method may be suitable for this process, during this kind of deposition methods, the side walls of the patterned photoresist are not covered with the metal thin films and lift-off process is possible to perform. Then lift-off process is performed by soaking the wafer in acetone solution for few minutes.

Figure 14:
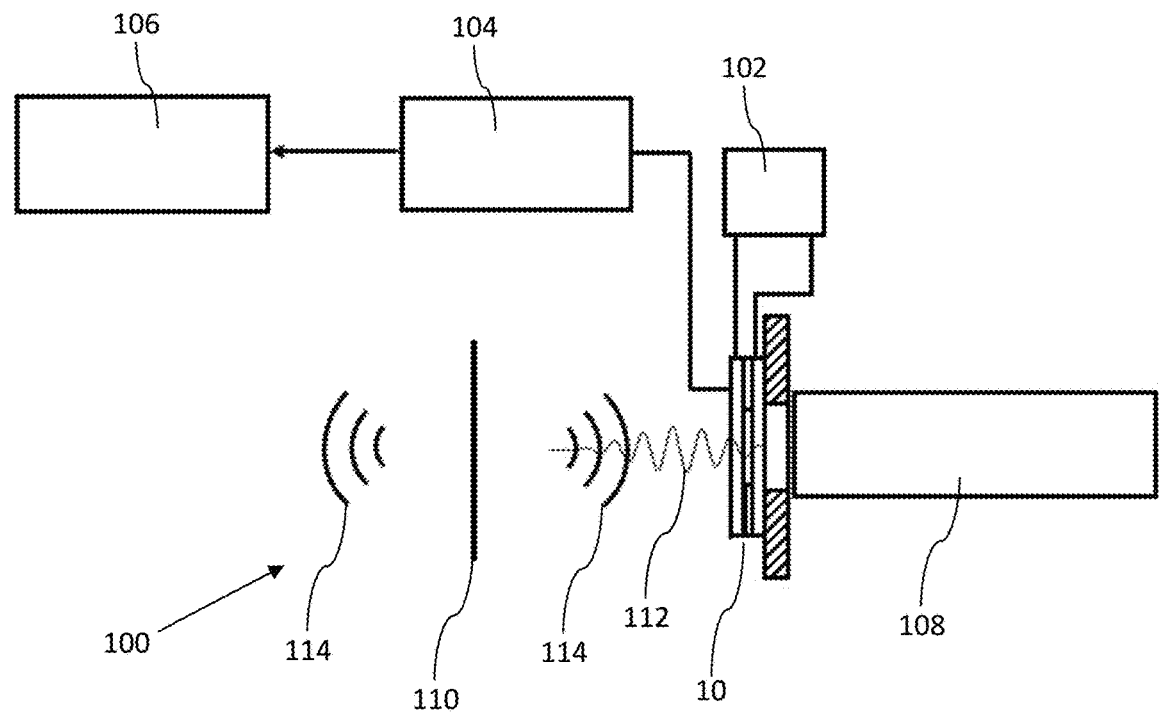
FIG. 14 is schematic diagram of an optical-acoustic imaging system.

Referring to FIG. 14, transparent ultrasound transducer 10 may be used as a component in an optical-acoustic imaging system 100. Imaging system has a voltage source 102 that applies a biasing voltage between top electrode 24 and bottom electrode 16 and a receiver 104 transparent ultrasound transducer 10 to receive electrical signals generated by transducer structure 14. An excitation source 108 is configured to excite a sample 110 to be imaged. As shown, excitation source is a light source that illuminates and excites sample 110 with a beam 112 that passes through transparent ultrasound transducer 10. The light source may be a single wavelength source such as a laser, or it may be a broadband light source. Additionally, while the light source is generally visible light, it may also be a source of non-visible light, such as infrared, ultraviolet, or microwave. Excitation source may be any type of source that is able to excite acoustic vibrations in sample 10. A processor 106 receives the electrical signals from the receiver to generate an image of sample 110. Imaging system 10 has a light source 108 configured to excite acoustic signals 114 from sample 110 to be imaged. In one example, shown in FIG. 14, transducer 10 is placed between light source 108 and object 110 such that a beam 112 from light source 108 must pass through transparent transducer 10 to image object 110.

Other configurations for excitation source 108 may be used, such as by illuminating sample 110 from beside transparent ultrasound transducer 10. This may allow for reflected or fluorescent light from sample 110 to pass through transparent ultrasound transducer 10 for collection in addition to the acoustic signal 114.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings but should be given the broadest interpretation consistent with the description as a whole.

What is claimed is:

1. A transparent ultrasound transducer, comprising:
   a transparent substrate; and
   a transparent transducer structure comprising a bottom electrode adjacent to the substrate, a top electrode electrically insulated from the bottom electrode, and an array of acoustically active elements within a separating layer between the top electrode and the bottom electrode;
   wherein:
      the top electrode and the bottom electrode comprising a conductive transparent material;
      the top electrode, the bottom electrode, or both the top electrode and the bottom electrode comprise a composite layer made from the conductive transparent material and a supplemental material that has a conductivity greater than a conductivity of the conductive transparent material; and
      a majority of an area of the composite layer comprises the conductive transparent material.

2. The transparent ultrasound transducer of claim 1, wherein the supplemental material comprises strips of metal.

3. The transparent ultrasound transducer of claim 1, wherein the supplemental material comprises less than about 30% of the area of the composite layer.

4. The transparent ultrasound transducer of claim 1, having a transparency of at least 70% within a selected range of wavelengths.

5. The transparent ultrasound transducer of claim 1, wherein the array of acoustically active elements comprises cavities, a membrane, and an insulating layer.

6. The transparent ultrasound transducer of claim 5, wherein the membrane comprises one or more materials selected from a group consisting of: silicon nitride, silicon dioxide, diamond, glass, quartz, and lithium niobate.

7. The transparent ultrasound transducer of claim 1, wherein the array of acoustically active elements comprises piezoelectric material or electrostrictive material.

8. The transparent ultrasound transducer of claim 1, wherein the top electrode comprises a plurality of electrically isolated top electrodes.

9. The transparent ultrasound transducer of claim 1, wherein the bottom electrode comprises a plurality of electrically isolated bottom electrodes.

10. An acoustic imaging system comprising:
    at least one transparent transducer structure comprising:
       a transparent substrate;
       a transparent transducer structure comprising a bottom electrode adjacent to the substrate, a top electrode electrically insulated from the bottom electrode, and an array of acoustically active elements within a separating layer between the top electrode and the bottom electrode;
       wherein:
          the top electrode and the bottom electrode comprising a conductive transparent material;
          the top electrode, the bottom electrode, or both the top electrode and the bottom electrode comprise a composite layer made from the conductive transparent material and a supplemental material that has a conductivity that is greater than a conductivity of the conductive transparent material; and
          a majority of a surface area of the composite layer comprises the conductive transparent material;
    a voltage source configured to apply a voltage between the top electrode and the bottom electrode;
    an excitation source that is configured to excite a sample to be imaged;
    a receiver connected to receive electrical signals generated by the transparent transducer structure; and
    a processor that receives the electrical signals from the receiver and generates an image of the sample.

11. The acoustic imaging system of claim 10 wherein the excitation source comprises a light source that illuminates the sample.

12. The acoustic imaging system of claim 11 wherein the light source illuminates the sample through the at least one transparent ultrasound transducer.

13. The acoustic imaging system of claim 10, further comprising an optical receiver positioned to receive light from the sample through the at least one transparent ultrasound transducer.

14. The acoustic imaging system of claim 10, wherein the at least one transparent transducer structure comprises a plurality of transparent transducer structures defined by a plurality of electrically isolated top electrodes.

15. The acoustic imaging system of claim 10, wherein the at least one transparent transducer structure comprises a plurality of transparent transducer structures defined by a plurality of electrically isolated bottom electrodes.

16. The acoustic imaging system of claim 10, wherein the supplemental material comprises strips of metal.

17. The acoustic imaging system of claim 10, wherein the supplemental material comprises less than about 30% of the surface area of the composite layer.

18. The acoustic imaging system of claim 10, wherein the at least one transparent ultrasound transducer has a transparency of at least 70% within a selected range of wavelengths.

19. The acoustic imaging system of claim 10, wherein the array of acoustically active elements comprises cavities, a membrane, and at least one of an insulating layer, a piezoelectric material, and electrostrictive material.

20. The acoustic imaging system of claim 19, wherein the membrane comprises one or more materials selected from a group consisting of silicon nitride, silicon dioxide, diamond, glass, quartz, and lithium niobate.

* * * * *